(12) United States Patent
Miyoshi et al.

(10) Patent No.: US 8,771,541 B2
(45) Date of Patent: Jul. 8, 2014

(54) POLYMER COMPOSITE PIEZOELECTRIC BODY AND MANUFACTURING METHOD FOR THE SAME

(71) Applicant: FUJIFILM Corporation, Tokyo (JP)

(72) Inventors: Tetsu Miyoshi, Ashigara-kami-gun (JP); Tsutomu Sasaki, Ashigara-kami-gun (JP); Yukio Sakashita, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/908,660

(22) Filed: Jun. 3, 2013

(65) Prior Publication Data

US 2013/0256581 A1    Oct. 3, 2013

Related U.S. Application Data

(63) Continuation of application No. PCT/JP2011/077678, filed on Nov. 30, 2011.

(30) Foreign Application Priority Data

Dec. 17, 2010   (JP) .................. 2010-282068
Jul. 11, 2011   (JP) .................. 2011-153022

(51) Int. Cl.
*H01L 41/193*   (2006.01)

(52) U.S. Cl.
USPC ............... 252/62.9 R; 252/62.9 PZ; 264/436; 427/100

(58) Field of Classification Search
USPC ........ 252/62.9 R, 62.9 PZ; 264/436; 427/100
See application file for complete search history.

(56) References Cited

FOREIGN PATENT DOCUMENTS

| JP | 5-315072 | * | 11/1993 |
|----|----------|---|---------|
| JP | 2007-157413 A | | 6/2007 |
| WO | WO 2008/010667 | * | 1/2008 |

OTHER PUBLICATIONS

Translation of JP 5-315072, Nov. 26, 1993.*
International search report issued in PCT/JP2011/077678 mailed Dec. 27, 2011.
International Preliminary Report on Patentability (Forms PCT/IB/338, PCT/IB/373 and PCT/ISA/237) issued on Jun. 27, 2013 in PCT/JP2011/077678.

* cited by examiner

*Primary Examiner* — Carol M Koslow
(74) *Attorney, Agent, or Firm* — Birch, Stewart, Kolasch & Birch LLP

(57) ABSTRACT

A polymer composite piezoelectric body is obtained by conducting polarization treatment on a composite having piezoelectric particles uniformly mixed by dispersion in a polymer matrix containing cyanoethylated polyvinyl alcohol.

15 Claims, 4 Drawing Sheets

US 8,771,541 B2

POLYMER COMPOSITE PIEZOELECTRIC BODY AND MANUFACTURING METHOD FOR THE SAME

CROSS REFERENCE TO RELATED APPLICATIONS

This application is a Continuation of PCT International Application No. PCT/JP2011/077678 filed on Nov. 30, 2011, which claims Priority on Patent Application No. 2010-282068 filed in Japan on Dec. 17, 2010 and Patent Application No. 2011-153022 filed in Japan on Jul. 11, 2011. The entire contents of all of the above applications are hereby expressly incorporated by reference into the present application.

BACKGROUND OF THE INVENTION

The present invention relates to polymer composite piezoelectric bodies suitable for piezoelectric devices, sensors, ultrasound probes, electric power generating devices, vibration-powered generators, and the like, as well as methods of manufacturing such piezoelectric bodies. The present invention is particularly directed to a polymer composite piezoelectric body having piezoelectric particles uniformly mixed by dispersion in a polymer matrix composed of cyanoethylated polyvinyl alcohol, and a method of manufacturing such a piezoelectric body.

Polymeric piezoelectric materials are those piezoelectric materials which have characteristics inherent to polymer materials, such as good flexibility, high-impact properties, ease of machining, and ability to have an increased area, which are high in power output constant (piezoelectric "g" constant) as compared with inorganic piezoelectric materials, and which are similar in acoustic impedance to the human body or water, so that their application to various sensors, or ultrasonic transducers such as an ultrasound probe and a hydrophone, vibration controllers (dampers), or to the vibration energy harvesting is expected nowadays. In such fields of application, those piezoelectric materials are sought which have a piezoelectric strain constant ("d" constant) as an index to the strain amount per unit electric field (signal sending ability) and a "g" constant as an index to the strength of electric field generated per unit stress (signal receiving ability) both favorable in magnitude, or are excellent in balance between the constants.

The polymeric piezoelectric materials are known to include piezoelectric polymers, namely, the polymers piezoelectric in themselves as typified by polyvinylidene fluoride (PVDF), which are low in "d" constant as compared with inorganic piezoelectric materials and, accordingly, cannot effect adequate performance if used for the above applications as a polymeric piezoelectric material.

On the other hand, the polymer composite piezoelectric which is obtained by using a polymer material as a matrix and mixing an inorganic piezoelectric into the polymer matrix to produce a piezoelectric composite is a piezoelectric allowed to have the above advantages typical of polymer materials and an excellent piezoelectric performance ("d" constant) of the inorganic piezoelectric in an effective manner. Polymer composite piezoelectrics are claiming attention as a piezoelectric variable in material design with different applications by changing the type of a polymer serving as a matrix, the type or composition of the inorganic piezoelectric, the connectivity, or the shape, or the blending ratio. In consequence, a variety of polymer composite piezoelectrics have been proposed (see Patent Literature 1, for instance).

As a matter of course, it is preferable that a piezoelectric with high piezoelectric performance is used for a polymer composite piezoelectric, so that use is chiefly made of lead-based piezoelectric materials having extremely high "d" constants, such as lead zirconate titanate ($Pb(Zr,Ti)O_3$: PZT).

Patent Literature 1 discloses the electronic component material having good dielectricity, pyroelectricity and piezoelectricity that is obtained by forming a composite product by uniformly mixing by dispersion a ferroelectric substance consisting of ceramic particles with a perovskite-type crystal structure in a dielectric binder composed of cyanoethylated cellulose and/or cyanoethylated pullulan, and applying a specified voltage to the composite product.

CITATION LIST

Patent Literature 1: JP 2007-157413 A

SUMMARY OF THE INVENTION

In the electronic component material as disclosed in Patent Literature 1, however, the composite product as a combination of cyanoethylated pullulan and piezoelectric particles that is formed on a substrate by casting is liable to undergo, during subsequent poling (polarization treatment) conducted thereon, dielectric breakdown at spots with low withstand voltages caused therein by an uneven thickness or nonuniform particle dispersion, which makes large-area production difficult. Moreover, cyanoethylated pullulan has a poor adhesion to other types of materials, and is liable to have troubles, such as cracking and peeling off, during the step of drying following the casting, which also makes large-area production difficult.

An object of the present invention is to solve the above problems with the prior art so as to provide a method of manufacturing a polymer composite piezoelectric body, allowing manufacture with high yields involving neither dielectric breakdown nor peeling off even for polymer composite piezoelectric bodies of large area, and a polymer composite piezoelectric body manufactured by such a method.

In order to achieve the above object, the present invention provides a polymer composite piezoelectric body obtained by conducting poling on a composite having piezoelectric particles uniformly mixed by dispersion in a polymer matrix comprising cyanoethylated polyvinyl alcohol (cyanoethylated PVA).

It should be noted that not only the composite having piezoelectric particles uniformly mixed by dispersion in a polymer matrix that is to be subjected to poling but the polymer composite piezoelectric body which is obtained by conducting polarization treatment (poling) on the composite may be referred to as "piezoelectric composite."

In the present invention, it is preferable that the polymer matrix is cyanoethylated polyvinyl alcohol to which is added at least one high-dielectric or ferroelectric polymer out of fluoropolymers, such as polyvinylidene fluoride, vinylidene fluoride-tetrafluoroethylene copolymer, vinylidene fluoride-trifluoroethylene copolymer, polyvinylidene fluoride-trifluoroethylene copolymer, and polyvinylidene fluoride-tetrafluoroethylene copolymer; or out of cyano group- or cyanoethyl group-containing polymers, such as vinylidene cyanate-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, and cyanoethyl sorbitol; or out of synthetic rubbers, such as nitrile rubber and chloroprene rubber.

It is also preferable in the present invention that the piezoelectric particles comprise ceramic particles having a perovskite-type crystal structure. In that case, the ceramic particles are composed of, for instance, lead zirconate titanate, lead lanthanate zirconate titanate, barium titanate, or a solid solution of barium titanate and bismuth ferrite.

The present invention also provides a method of manufacturing a polymer composite piezoelectric body, comprising the steps of: forming, on a substrate, a composite having piezoelectric particles uniformly mixed by dispersion in a polymer matrix comprising cyanoethylated polyvinyl alcohol; and conducting poling on the composite.

Preferably, the step of forming a composite includes casting a piezoelectric particle-containing coating solution onto the substrate, with the coating solution being obtained by dispersing the piezoelectric particles in an organic solvent in which a dielectric binder comprising the cyanoethylated polyvinyl alcohol has been dissolved; and then evaporating the organic solvent so as to form a coating film.

The substrate is preferably any of various metal sheets, or a polymer film provided on its at least one face with a coating/foil of metal, such as aluminum or copper, serving as a lower electrode. A composite product comprising an organic polymer and conductive particles may also be used for the substrate. In that case, the organic polymer is preferably composed of at least one out of a thermoplastic resin, a thermoplastic elastomer, and a vulcanized rubber. For the conductive particles, C, Pd, Fe, Sn, Al, Ni, Pt, Au, Ag, Cu, Cr, Mo, or an alloy thereof is used.

The method of casting the coating solution onto the substrate may be any of conventional solution casting methods including doctor coating and blade coating. A composite formed by a conventional casting method generally has a thickness of about 50 to 100 µm.

The step of conducting poling preferably includes providing an upper electrode on a surface of the composite that is opposite with a face in contact with the substrate, then heating the composite to a specified temperature, and applying a direct electric field between the substrate (lower electrode) and the upper electrode for a specified period of time.

It is also possible that the step of conducting poling includes the step of applying a specified direct electric field between the substrate (lower electrode) and a corona electrode in rod or wire form, which is positioned at a specified distance from a surface of the composite that is opposite with a face in contact with the substrate, and which is movable along the surface of the composite, while heating the composite to a specified temperature and keeping it at that temperature, so as to cause corona discharge; and, under the corona discharge, causing the corona electrode to move relatively to the composite along the surface of the composite.

The temperature to which the composite is to be heated during the poling is preferably 60 to 120° C.

It is preferable that the piezoelectric particles comprise ceramic particles having a perovskite-type crystal structure. In that case, the ceramic particles are composed of, for instance, lead zirconate titanate, lead lanthanate zirconate titanate, barium titanate, or a solid solution of barium titanate and bismuth ferrite.

The dielectric binder may be cyanoethylated polyvinyl alcohol to which is added at least one high-dielectric or ferroelectric polymer out of fluoropolymers, such as polyvinylidene fluoride, vinylidene fluoride-tetrafluoroethylene copolymer, vinylidene fluoride-trifluoroethylene copolymer, polyvinylidene fluoride-trifluoroethylene copolymer, and polyvinylidene fluoride-tetrafluoroethylene copolymer; or out of cyano group- or cyanoethyl group-containing polymers, such as vinylidene cyanate-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, and cyanoethyl sorbitol; or out of synthetic rubbers, such as nitrile rubber and chloroprene rubber.

According to the present invention in which cyanoethylated PVA having a softening temperature in the vicinity of room temperature is used for a polymer matrix, mechanical constraints on piezoelectric particles can be reduced at relatively low heating temperatures with no increase in leak current. In consequence, a field strength required for poling is significantly reduced, which makes it possible to suppress dielectric breakdown even if there are spots with low withstand voltages caused in a composite by an uneven thickness or nonuniform dispersion of piezoelectric particles. In addition, by using, as a binder, cyanoethylated PVA having a good adhesion to other types of materials, such troubles as cracking and peeling off are suppressed during the step of drying following the casting.

The use of cyanoethylated PVA for a polymer matrix thus makes it possible to attain the method of manufacturing a polymer composite piezoelectric body that allows manufacture with high yields involving neither dielectric breakdown nor peeling off even for polymer composite piezoelectric bodies of large area, and the polymer composite piezoelectric body which is free from dielectric breakdown and peeling off even if large in area.

DETAILED DESCRIPTION OF THE INVENTION

In the following, the polymer composite piezoelectric body and the manufacturing method thereof according to the present invention are detailed based on a preferred embodiment shown in the accompanying drawings.

Figure 1:
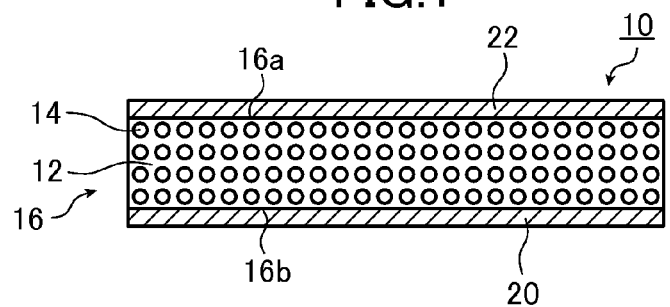
FIG. 1 is a schematic diagram showing a polymer composite piezoelectric body as an embodiment of the present invention.

FIG. 1 is a schematic diagram showing a polymer composite piezoelectric body as an embodiment of the present invention.

A polymer composite piezoelectric body (piezoelectric composite) 10 shown in FIG. 1 is obtained by conducting poling on a composite 16 having piezoelectric particles 14 of a ferroelectric material uniformly dispersed in a polymer matrix 12 composed of cyanoethylated polyvinyl alcohol (hereafter also referred to as "cyanoethylated PVA"). The polymer composite piezoelectric body 10 includes a lower electrode 20 and an upper electrode 22, with the former being provided on a bottom face 16b, and the latter on a top face 16a, of the composite 16 for instance.

The polymer matrix 12 is not limited to cyanoethylated PVA alone but may be the cyanoethylated PVA to which is added at least one high-dielectric or ferroelectric polymer out of fluoropolymers, such as polyvinylidene fluoride, vinylidene fluoride-tetrafluoroethylene copolymer, vinylidene fluoride-trifluoroethylene copolymer, polyvinylidene fluoride-trifluoroethylene copolymer, and polyvinylidene fluoride-tetrafluoroethylene copolymer; or out of cyano group- or cyanoethyl group-containing polymers, such as vinylidene cyanate-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, and cyanoethyl sorbitol; or out of synthetic rubbers, such as nitrile rubber and chloroprene rubber.

The piezoelectric particles 14 are comprised of ceramic particles having a perovskite-type crystal structure. The ceramic particles which constitute the piezoelectric particles 14 are composed of lead zirconate titanate (PZT), lead lanthanate zirconate titanate (PLZT), barium titanate ($BaTiO_3$) or a solid solution (BFBT) of barium titanate and bismuth ferrite ($BiFe_3$), for instance.

The polymer composite piezoelectric body 10 is excellent in flexibility because the polymer matrix 12 is used for it.

The polymer composite piezoelectric body 10 may include a conductive or nonconductive substrate provided on at least one out of the top face 16a and the bottom face 16b of the composite 16. The substrate is preferably flexible.

Figure 2:
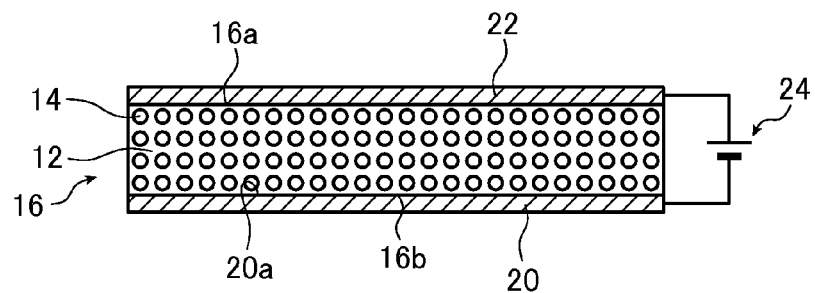
FIG. 2 is a schematic diagram illustrating an example of the poling method to be used for the manufacture of the polymer composite piezoelectric body as an embodiment of the present invention.

The manufacturing method of the polymer composite piezoelectric body 10 is described in reference to FIG. 2.

The lower electrode 20 of conductive nature is initially prepared. The lower electrode 20 may also be a conductive film formed on another substrate (not shown) by sputtering or the like.

Then, the composite 16 is formed on a surface 20a of the lower electrode 20.

In the method of forming the composite 16, a specified amount of the piezoelectric particles 14 are dispersed uniformly in an organic solvent, such as methyl ethyl ketone, cyclohexanone or dimethylformamide (DMF), with a dielectric binder dissolved therein, which is composed of cyanoethylated PVA and adapted to serve as the polymer matrix 12, so as to obtain a piezoelectric particle-containing coating solution, and the coating solution is cast onto the surface 20a of the lower electrode 20, then the organic solvent is evaporated to form the composite 16.

The composite 16 may be formed by, apart from the method by casting as above, a method by extrusion using a melted dielectric binder with piezoelectric particles dispersed therein.

In this embodiment, the dielectric binder to be used is not limited to cyanoethylated PVA alone but may be the cyanoethylated PVA to which is added at least one high-dielectric or ferroelectric polymer out of fluoropolymers, such as polyvinylidene fluoride, vinylidene fluoride-tetrafluoroethylene copolymer, vinylidene fluoride-trifluoroethylene copolymer, polyvinylidene fluoride-trifluoroethylene copolymer, and polyvinylidene fluoride-tetrafluoroethylene copolymer; or out of cyano group- or cyanoethyl group-containing polymers, such as vinylidene cyanate-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, and cyanoethyl sorbitol; or out of synthetic rubbers, such as nitrile rubber and chloroprene rubber.

The upper electrode 22 is then formed on the top face 16a of the composite 16 by sputtering, for instance.

The lower electrode 20 and the upper electrode 22 are connected with a DC power source 24. A heating mechanism for heating the composite 16 and keeping it heated, such as a hot plate, is set so as to heat the composite 16 to a temperature of, for instance, 100° C. With the composite 16 being kept at the temperature, a DC electric field of several tens to several hundreds kV/cm, 50 kV/cm for instance, is applied between the lower and upper electrodes 20 and 22 by the power source 24 for a specified period of time so as to carry out poling.

During the poling, a DC electric field is applied to the piezoelectric particles 14 along the direction of the thickness of the composite 16, in which direction the lower electrode 20 and the upper electrode 22 are opposite to each other, so as to carry out poling and thereby obtain the polymer composite piezoelectric body 10.

The lower electrode 20 and the upper electrode 22 are so conductive as to allow a specified voltage to be applied to the composite 16 during poling, and may be composed of C, Pd, Fe, Sn, Al, Ni, Pt, Au, Ag, Cu, Cr, Mo, or an alloy thereof.

The lower electrode 20 and the upper electrode 22 may be formed by vapor deposition, such as vacuum deposition and sputtering, or by printing, such as screen printing and inkjet printing. It is also possible to provide the lower electrode 20 and the upper electrode 22 in the form of foil composed of the above C, Pd, Fe, Sn, Al, Ni, Pt, Au, Ag, Cu, Cr, Mo, or alloy thereof.

The lower electrode 20 and the upper electrode 22 may also be provided using a composite product composed of an organic polymer and conductive particles. In that case, the organic polymer to be used may be at least one out of a thermoplastic resin, a thermoplastic elastomer and a vulcanized rubber, and the conductive particles to be used may be particles of the above C, Pd, Fe, Sn, Al, Ni, Pt, Au, Ag, Cu, Cr, Mo, or alloy thereof.

Figure 3A:
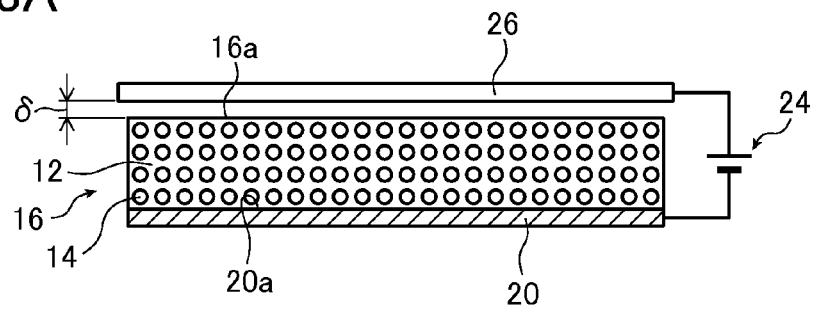
FIG. 3A is a schematic diagram illustrating another example of the poling method to be used for the manufacture of the polymer composite piezoelectric body as an embodiment of the present invention.
Figure 3B:
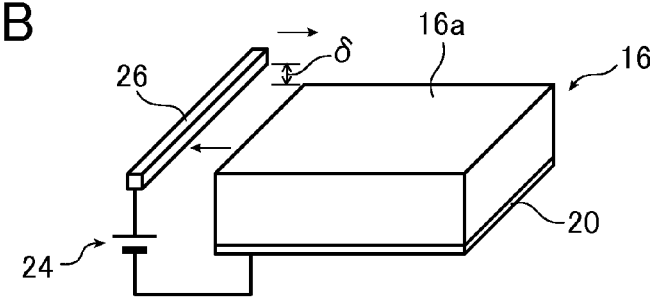
FIG. 3B is a schematic perspective illustrating another example of the poling method.

In this embodiment, poling may be carried out as shown in FIGS. 3A and 3B. In that case, after the composite 16 is formed on the surface 20a of the lower electrode 20, a corona electrode 26 in rod or wire form, which is movable along the top face 16a of the composite 16, is provided above the top face 16a of the composite 16 at a distance δ of up to several mm, 1 mm for instance, from the top face 16a, as seen from FIGS. 3A and 3B. The corona electrode 26 and the lower electrode 20 are connected with the DC power source 24. In addition, a heating mechanism for heating the composite 16 and keeping it heated, such as a hot plate, is prepared.

With the composite 16 being heated to and kept at a temperature of, for instance, 100° C., a DC voltage of several kV, 6 kV for instance, is applied between the lower electrode 20 and the corona electrode 26 by the power source 24 so as to generate corona discharge, and poling is carried out by moving the corona electrode 26 located above the top face 16a of the composite 16 along the top face 16a. Hereafter, the poling utilizing corona discharge is also referred to as "corona poling treatment."

In order to move the corona electrode 26, a known moving mechanism can be used. The poling is not necessarily carried out by moving the corona electrode 26 but may be carried out by providing a mechanism for moving the composite 16 so as to move the composite 16. Thus, the moving mechanism for the corona electrode 26 is not particularly limited as long as it allows the corona electrode 26 to move relatively to the composite 16.

Depending on the configuration to which the polymer composite piezoelectric body 10 is to be applied, the lower electrode 20 may be removed after the poling. On the other hand, the corona electrode 26 is not limited in number to one, that is to say, may be two or more in number.

In the case where the corona electrode 26 is used for poling as shown in FIGS. 3A and 3B, a roll-to-roll method may be employed so as to conduct poling on the composite 16 transported in its longitudinal direction with a plurality of corona electrodes 26 provided in the transport path for the composite 16 so that they may be opposite to the top face 16a of the composite. As a result, the polymer composite piezoelectric body 10 can be manufactured with a large area.

The polymer composite piezoelectric body of this embodiment is usable as, for instance, various sensors including an ultrasonic sensor, a pressure sensor, a tactile sensor, and a strain sensor; acoustic devices such as a microphone, a pickup, and a speaker; ultrasonic transducers such as an ultrasound probe and a hydrophone; a vibration controller (damper) for use in vehicles, buildings, or sporting goods such as skis and rackets; or even as an electric power generating device. In the last case, the piezoelectric body of this embodiment is suitably used as a vibration-powered generator applied to a floor, a shoe, a tire, and the like.

The configuration of the present invention is fundamentally as above. While the polymer composite piezoelectric body and the manufacturing method thereof according to the present invention have thus been detailed, the present invention is in no way limited to the embodiment as described above, and it is without saying that various improvements or modifications may be made without departing from the scope of the present invention.

EXAMPLES

A detailed description is made below on the effects of the polymer composite piezoelectric body of the present invention.

In the following working example, polymer composite piezoelectric bodies were fabricated using cyanoethylated PVA for a dielectric binder, and measured in $d_{33}$ under their respective poling conditions. In order to confirm the effects of the polymer composite piezoelectric body of the invention, polymer composite piezoelectric bodies for comparison were fabricated using cyanoethylated pullulan for a dielectric binder, and similarly measured in $d_{33}$ under their respective poling conditions.

Samples were fabricated as follows: Initially, a piezoelectric particle-containing coating solution was prepared by adding PZT particles and cyanoethylated PVA (CR-V manufactured by Shin-Etsu Chemical Co., Ltd.) as a binder to an organic solvent composed of dimethylformamide (DMF) at the compositional ratio as below and dispersing them in the solvent using a propeller mixer (at a number of revolution of 2000 rpm).

PZT particles . . . 300 parts by weight
Cyanoethylated PVA . . . 30 parts by weight The PZT particles as used were the commercially available raw PZT powder which had been sintered at 1000 to 1200° C., then crushed and classified so as to attain a mean particle size of 5 μm.

A slide coater was used to apply the piezoelectric particle-containing coating solution onto an aluminum substrate (300 μm in thickness) in an A4-sized coating area thereof (30 cm×21 cm) so that the dried coating film might have a thickness of 70 μm, before DMF was evaporated by the drying by heating on a hot plate at 120° C. A composite in the form of an A4-sized coating with a thickness of 70 μm was thus formed on the aluminum substrate.

Then, the composite was divided into 20 mm-square pieces along with the aluminum substrate, and an upper electrode composed of aluminum and having a diameter of 15 mm and a thickness of 0.5 μm was formed on each composite piece by vacuum deposition.

Finally, poling was carried out by applying a specified DC electric field between the upper electrode and the aluminum substrate (lower electrode). Poling conditions were as follows.

Temperature: 20 to 160° C.
Field strength: 5 to 200 kV/cm
Time: 3 min.

The polymer composite piezoelectric body samples as fabricated under their respective poling conditions were measured in piezoelectric constant $d_{33}$ by using a $d_{33}$ meter (PM300 manufactured by Piezotest Corp.) at a frequency of 110 Hz, a clamping force of 10 N, and a dynamic force of 0.25 N.

Figure 4:
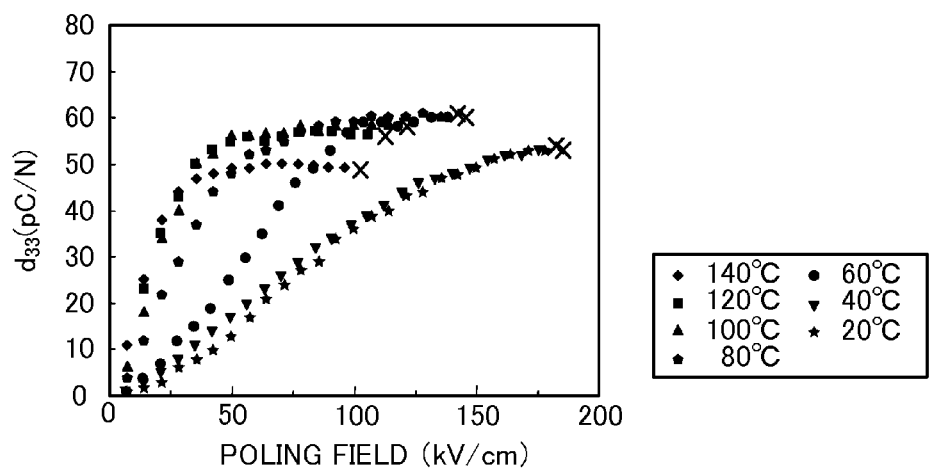
FIG. 4 is a graph representing the relationship between poling conditions and $d_{33}$ in the polymer composite piezoelectric bodies as fabricated by using cyanoethylated PVA for a dielectric binder.
Figure 5:
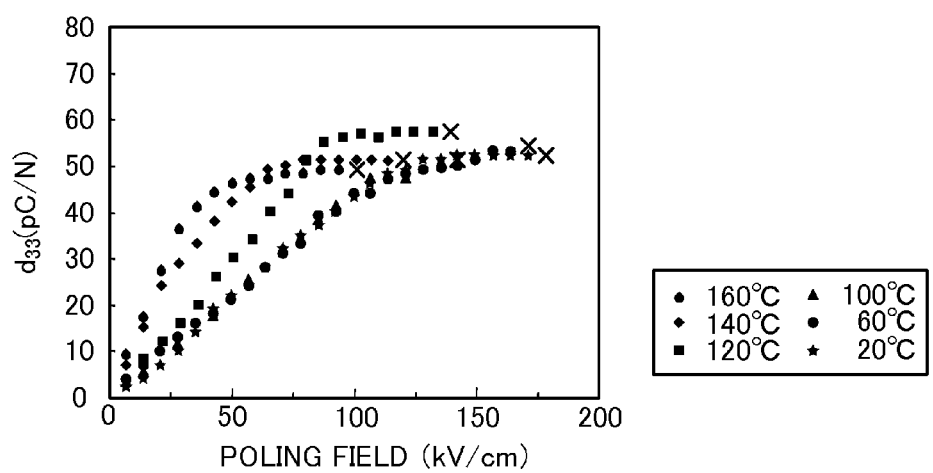
FIG. 5 is a graph representing the relationship between poling conditions and $d_{33}$ in the polymer composite piezoelectric bodies as fabricated by using cyanoethylated pullulan for a dielectric binder.

FIG. 4 represents the relationship between poling conditions and $d_{33}$ in the polymer composite piezoelectric bodies as fabricated in this working example by using cyanoethylated PVA for a binder. FIG. 5 represents the relationship between poling conditions and $d_{33}$ in the polymer composite piezoelectric bodies as fabricated for comparison by using cyanoethylated pullulan for a binder.

It is seen from FIGS. 4 and 5 that the rise of $d_{33}$ with respect to the electric field was improved with the increase in temperature irrespective of whether cyanoethylated PVA or cyanoethylated pullulan was used for a binder.

Figure 6:
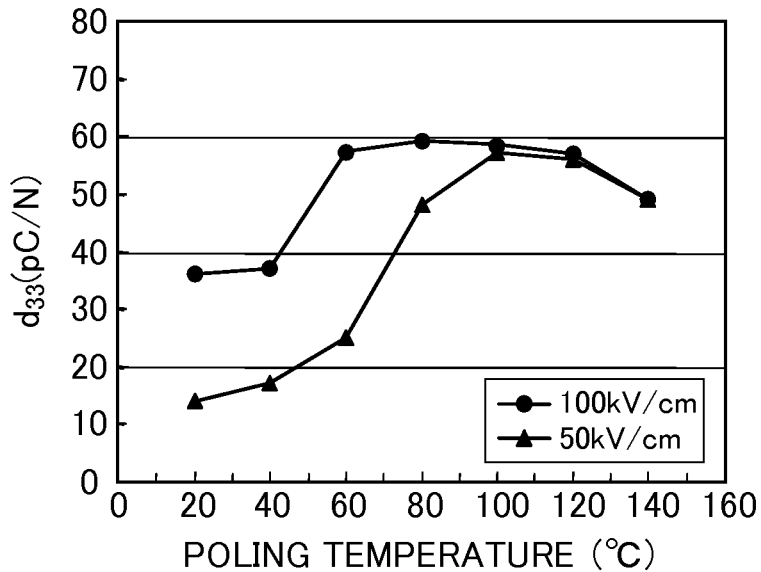
FIG. 6 is a graph representing the relationship between the poling temperature and $d_{33}$ in the polymer composite piezoelectric bodies as fabricated by using cyanoethylated PVA for a dielectric binder.

In FIG. 6, the $d_{33}$ values at electric fields of 50 kV/cm and 100 kV/cm as shown in FIG. 4 are plotted. Similarly in FIG. 7, the $d_{33}$ values at electric fields of 50 kV/cm and 100 kV/cm as shown in FIG. 5 are plotted.

As seen from FIG. 6, $d_{33}$ was improved at poling temperatures not lower than 40° C. if cyanoethylated PVA was used. The value of $d_{33}$ was high, that is to say, not lower than 55 pC/N in the temperature range of 100 to 120° C. at an electric field of 50 kV/cm, and in the temperature range of 60 to 120° C. at an electric field of 100 kV/cm.

Figure 7:
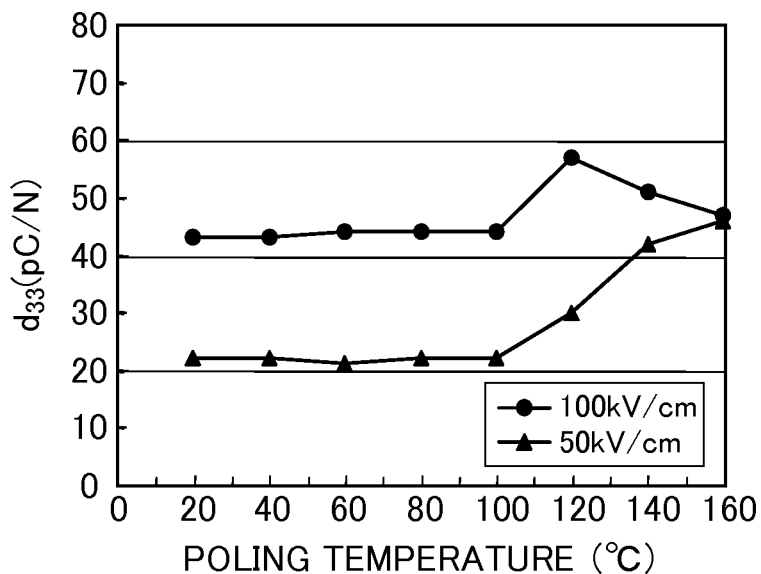
FIG. 7 is a graph representing the relationship between the poling temperature and $d_{33}$ in the polymer composite piezoelectric bodies as fabricated by using cyanoethylated pullulan for a dielectric binder.

On the other hand, it is seen from FIG. 7 that $d_{33}$ was improved at poling temperatures not lower than 100° C. if cyanoethylated pullulan was used. The value of $d_{33}$, however, was not higher than 50 pC/N at any temperature in the case of an electric field of 50 kV/cm, and was only higher than 55 pC/N at a temperature of 120° C. in the case of an electric field of 100 kV/cm.

There was a tendency of $d_{33}$ to decrease at a poling temperature higher than 120° C. irrespective of whether cyanoethylated PVA or cyanoethylated pullulan was used as a binder. This is because the leak current during poling is increased at such a temperature so considerably that an adequate electric field is no longer applied to piezoelectric particles.

As described above, the use of cyanoethylated PVA for a binder makes it possible to reduce the temperature and the field strength during poling significantly from those in the case where cyanoethylated pullulan is used. The reason is discussed below.

Generally speaking, piezoelectric ceramics with a perovskite-type crystal structure, typified by PZT, have no center of symmetry in the crystal structure and are polarized by the displacement of ions at temperatures lower than the Curie point. More considerable ion displacement will make a higher energy (field strength) required for poling, that is to say, make dielectric breakdown more liable to occur during poling. In addition, more considerable ion displacement will increase the deformation associated with poling, and cracks in ceramics, accordingly. In a technique commonly used during the poling of a piezoelectric ceramic to cope with such problems, a sample is heated to a temperature not higher than the Curie point so as to increase the symmetry of crystal and achieve thereby reduction in field strength required for poling and in deformation associated with poling.

In this working example, the poling temperature range in which $d_{33}$ got maximum varies between the case where cyanoethylated PVA was used for a binder and the case where cyanoethylated pullulan was used for a binder in spite of the fact that the piezoelectric ceramic particles as used were the same in both cases. This suggests that, if a polymer composite piezoelectric body composed of a polymer matrix and a piezoelectric ceramic is to be obtained by poling, one mechanism or another for reducing a field strength required for the poling functions as a result of the heating of a sample, apart from the increase of the symmetry of crystal of a piezoelectric ceramic as mentioned above.

Under the circumstances, the present inventors examined the temperature dependence of the electrical property (dielectric constant) and the mechanical property (hardness) each of which the different binders as used in this working example, cyanoethylated PVA and cyanoethylated pullulan, exhibited in themselves. Samples for the evaluation of electrical and mechanical properties were fabricated as follows.

Initially, each of the different binders, cyanoethylated PVA and cyanoethylated pullulan, was dissolved in an organic solvent composed of dimethylformamide (DMF), and the resultant solution was applied onto an aluminum substrate (300 μm in thickness) in an A4-sized coating area thereof (30 cm×21 cm) so that the dried coating film might have a thickness of 30 μm, before DMF was evaporated by the drying by heating on a hot plate at 120° C. The relevant binder in the form of an A4-sized sheet with a thickness of 30 μm was thus formed on the aluminum substrate. Then, each binder was divided into 20 mm-square pieces along with the aluminum substrate, and an upper electrode composed of aluminum and having a diameter of 15 mm and a thickness of 0.5 μm was formed on each binder piece by vacuum deposition.

The different binders in sheet form which had been formed as described above were measured in dielectric constant by using an impedance analyzer (4294A manufactured by Agilent Corp.) in the temperature range of 20 to 120° C. and at a frequency of 1 kHz. The binders were also measured in hardness by using a thermomechanical analyzer (TMA-60 manufactured by SHIMADZU CORPORATION) at a rate of temperature increase of 10° C./min. and with a load of 10 g.

Figure 8:
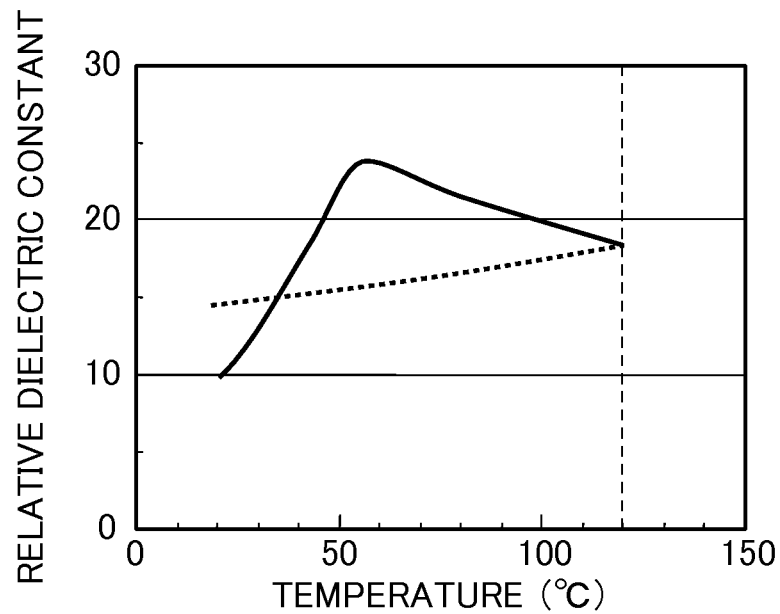
FIG. 8 is a graph showing the temperature dependence of an electrical property (dielectric constant) of different binders.

FIG. 8 shows the temperature dependence of the relative dielectric constant in the different binders. In FIG. 8, the property of cyanoethylated PVA is represented by a solid curve while that of cyanoethylated pullulan is represented by a dotted curve. It is seen from FIG. 8 that the dielectric constant of cyanoethylated PVA abruptly increased with the increase in temperature, got maximum at about 60° C., and then decreased again. The strength of electric field applied to a piezoelectric ceramic in a polymer binder increases as the binder has a higher dielectric constant, so that a temperature near 60° C. is expected to be most suitable for poling if the dielectric constant is solely to be taken into account. From the relationship between the poling temperature and $d_{33}$ (FIG. 6), however, it is seen that $d_{33}$ began to increase at about 40° C. and got maximum at about 100° C. in the case of a field strength of 50 kV/cm. The dielectric constant of cyanoethylated pullulan increased concomitantly with the increase in temperature in an almost linear manner. From the relationship between the poling temperature and $d_{33}$ (FIG. 7), however, it is seen that $d_{33}$ did not change in the range of 20 to 100° C. but began at last to increase at about 120° C. in the case of a field strength of 50 kV/cm. It is thus difficult to explain the reason why the poling temperature range in which $d_{33}$ got maximum varies between the case where cyanoethylated PVA was used as a binder and the case where cyanoethylated pullulan was used as a binder, exclusively based on the dielectric constants of the binders.

Figure 9:
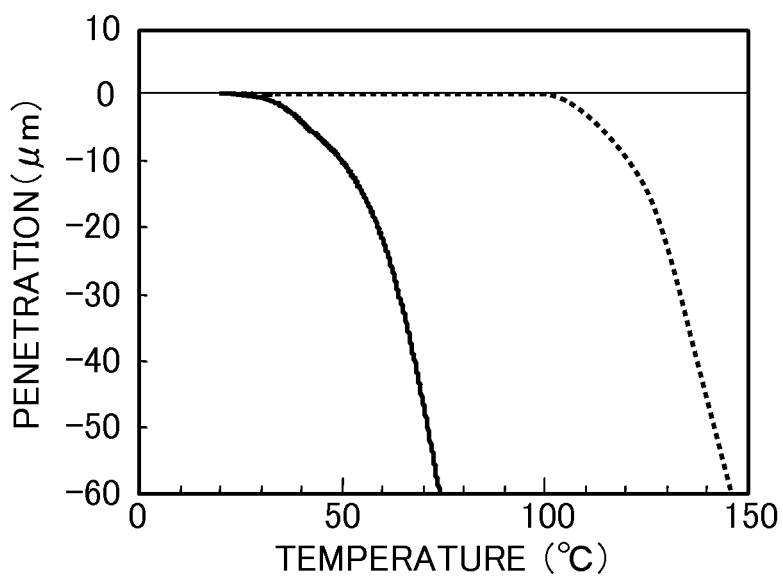
FIG. 9 is a graph showing the temperature dependence of a mechanical property (hardness) of different binders.

FIG. 9 shows the temperature dependence of the penetration in the different binders. In FIG. 9, the property of cyanoethylated PVA is represented by a solid curve while that of cyanoethylated pullulan is represented by a dotted curve. It is seen from FIG. 9 that the softening point of cyanoethylated PVA was about 30 to 40° C. while that of cyanoethylated pullulan was about 100 to 120° C. The softening points of the binders as such are evidently consistent with the temperatures at which $d_{33}$ began to increase in the relationships between the poling temperature and $d_{33}$ (FIGS. 6 and 7) as described before. In other words, the variation between the cases of cyanoethylated PVA and cyanoethylated pullulan having been used as a binder in the poling temperature range in which $d_{33}$ got maximum is attributed to the difference in hardness between the binders, so that it is considered that a field strength required for poling can be reduced by heating a sample so as to soften the binder.

The poling of a piezoelectric ceramic physically means nothing but the orientation of polarization by the displacement of a 180° domain wall in each crystal grain. If the piezoelectric ceramic is being dispersed in a polymer matrix, as is the case with the polymer composite piezoelectric body of this working example, many of 180° domain walls are under constraint of a binder, so that it is necessary for the displacement of 180° domain walls to overcome the constraint of the binder. In addition, the displacement of 180° domain walls is known to involve the displacement of non-180° domain walls. Such displacement causes considerable deformation of ceramic particles and, accordingly, requires again that the resistance from the binder be overcome. In other words, since energy required for the displacement of 180° and non-180° domain walls in a polymer composite piezoelectric body is strongly influenced by the force of constraint exerted by a binder, the reduction in mechanical constraint on piezoelectric particles by heating a sample to a temperature not lower than the softening point of the binder is considered to be very effective at reducing a field strength required for poling.

As a result of detailed investigations on the conditions for poling during the fabrication of a polymer composited piezoelectric body composed of a polymer matrix and a piezoelectric ceramic, the present inventors found that it is very effective at reducing a field strength required for poling to specify the poling temperature to be not lower than the softening temperature of a polymer binder, as described above. The finding is quite different from the conventional approach in which the symmetry of crystal of a piezoelectric ceramic is increased in order to reduce a field strength required for poling. Moreover, mechanical constraints on piezoelectric particles can be reduced at relatively low heating temperatures with no increase in leak current by using cyanoethylated PVA having a particularly low softening temperature among dielectric binders. In consequence, a field strength required for poling is significantly reduced, which makes it possible to suppress dielectric breakdown even if there are spots with low withstand voltages caused in a composite by an uneven thickness or nonuniform dispersion of piezoelectric particles. In addition, by using, as a binder, cyanoethylated PVA having a good adhesion to other types of materials, such troubles as cracking and peeling off are suppressed during the step of drying following the casting. In other words, the use of cyanoethylated PVA for a polymer matrix thus makes it possible to attain the method of manufacturing a polymer composite piezoelectric body that allows manufacture with high yields involving neither dielectric breakdown nor peeling off even for polymer composite piezoelectric bodies of large area, and the polymer composite piezoelectric body which is free from dielectric breakdown and peeling off even if large in area.

What is claimed is:

1. A polymer composite piezoelectric body obtainable by conducting poling treating on a composite having piezoelectric particles uniformly mixed by dispersion in a polymer matrix comprising cyanoethylated polyvinyl alcohol.

2. The polymer composite piezoelectric body according to claim 1, wherein said ceramic particles are composed of lead zirconate titanate, lead lanthanate zirconate titanate, barium titanate, or a solid solution of barium titanate and bismuth ferrite.

3. The polymer composite piezoelectric body according to claim 1, wherein said polymer matrix is made of cyanoethylated polyvinyl alcohol to which is added at least one member selected from the group consisting of polyvinylidene fluoride, vinylidne fluoride-tetrafluoroethylene copolymer, vinylidene fluoride-trifluoroethylene copolymer, polyvinylidene fluoride-trifluoroethylene copolymer, polyvinylidene fluoride-tetrafluoroethylene copolymer, vinylidene cyanate-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, cyanoethyl sorbitol, nitrile rubber and chloroprene rubber.

4. The polymer composite piezoelectric body according to claim 1, wherein said piezoelectric particles comprise ceramic particles having a perovskite-type crystal structure.

5. A method of manufacturing a polymer composite piezoelectric body, comprising the steps of:
   forming, on a substrate which is an electrode or a conductive substrate that acts as an electrode, a composite having piezoelectric particles uniformly mixed by dispersion in a polymer matrix comprising cyanoethylated polyvinyl alcohol; and
   conducting poling treating on the composite.

6. The method of manufacturing a polymer composite piezoelectric body according to claim 5, wherein said step of forming a composite includes the step of casting a piezoelectric particle-containing coating solution onto said substrate, with the coating solution being obtained by dispersing said piezoelectric particles in an organic solvent in which a dielectric binder comprising said cyanoethylated polyvinyl alcohol has been dissolved; and then evaporating the organic solvent so as to form a coating film.

7. The method of manufacturing a polymer composite piezoelectric body according to claim 6, wherein said dielectric binder is cyanoethylated polyvinyl alcohol to which is added at least one member selected from the group consisting of polyvinylidene fluoride, vinylidne fluoride-tetrafluoroethylene copolymer, vinylidene fluoride-trifluoroethylene copolymer, polyvinylidene fluoride-trifluoroethylene copolymer, polyvinylidene fluoride-tetrafluoroethylene copolymer, vinylidene cyanate-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, cyanoethyl sorbitol, nitrile rubber and chloroprene rubber.

8. The method of manufacturing a polymer composite piezoelectric body according to claim 5, wherein said step of conducting poling treating includes providing an upper electrode on a surface of said composite that is opposite with a face in contact with said substrate, then heating the composite to a specified temperature, and applying a direct electric field between the substrate and the upper electrode for a specified period of time.

9. The method of manufacturing a polymer composite piezoelectric body according to claim 8, wherein said composite is heated in said step of conducting poling treating to a temperature of 60 to 120° C.

10. The method of manufacturing a polymer composite piezoelectric body according to claim 5, wherein said step of conducting poling treating includes the step of applying a specified direct electric field between said substrate and a corona electrode in rod or wire form, which is positioned at a specified distance from a surface of said composite that is opposite with a face in contact with the substrate, and which is movable along the surface of the composite, while heating the composite to a specified temperature and keeping it at that temperature, so as to cause corona discharge; and, under the corona discharge, causing the corona electrode to move relatively to the composite along the surface of the composite.

11. The method of manufacturing a polymer composite piezoelectric body according to claim 5, wherein said piezoelectric particles comprise ceramic particles having a perovskite-type crystal structure.

12. The method of manufacturing a polymer composite piezoelectric body according to claim 5, wherein said substrate is a polymer film provided with a metal coating or metallic foil.

13. The method of manufacturing a polymer composite piezoelectric body according to claim 5, wherein said substrate is composed of a composite product comprising an organic polymer and conductive particles.

14. The method of manufacturing a polymer composite piezoelectric body according to claim 13, wherein at least one out of a thermoplastic resin, a thermoplastic elastomer, and a vulcanized rubber is used for said organic polymer.

15. The method of manufacturing a polymer composite piezoelectric body according to claim 13, wherein C, Pd, Fe, Sn, Al, Ni, Pt, Au, Ag, Cu, Cr, Mo, or an alloy thereof is used for said conductive particles.

* * * * *